(12) United States Patent
Javora et al.

(10) Patent No.: US 10,161,972 B2
(45) Date of Patent: Dec. 25, 2018

(54) CURRENT AND/OR VOLTAGE SENSOR DEVICE WITH A MEMORY ELEMENT

(71) Applicant: ABB TECHNOLOGY AG, Zurich (CH)

(72) Inventors: Radek Javora, Brno (CZ); Marek Pavlas, Otnice (CZ); Adrian Hozoi, Mannheim (DE); Jaromir Podzemny, Brno (CZ)

(73) Assignee: ABB Schweiz AG, Baden (CH)

( * ) Notice: Subject to any disclaimer, the term of this patent is extended or adjusted under 35 U.S.C. 154(b) by 590 days.

(21) Appl. No.: 14/667,089

(22) Filed: Mar. 24, 2015

(65) Prior Publication Data

US 2015/0192619 A1    Jul. 9, 2015

Related U.S. Application Data

(63) Continuation of application No. PCT/EP2013/002857, filed on Sep. 23, 2013.

(30) Foreign Application Priority Data

Sep. 24, 2012    (EP) .................................... 12006671

(51) Int. Cl.
*G01R 19/00*    (2006.01)
*G01R 35/00*    (2006.01)
(Continued)

(52) U.S. Cl.
CPC ....... *G01R 19/0046* (2013.01); *G01R 1/0416* (2013.01); *G01R 19/15* (2013.01);
(Continued)

(58) Field of Classification Search
CPC .. G01R 19/0046; G01R 19/15; G01R 19/155; G01R 1/0416; G01R 35/005; G01R 19/00
(Continued)

(56) References Cited

U.S. PATENT DOCUMENTS

| 5,918,194 A | 6/1999 | Banaska et al. |
| 2001/0003419 A1 | 6/2001 | Ribes |

(Continued)

FOREIGN PATENT DOCUMENTS

| CN | 200989917 Y | 12/2007 |
| CN | 201011504 Y | 1/2008 |

(Continued)

OTHER PUBLICATIONS

International Search Report (PCT/ISA/210) dated Nov. 15, 2015, by the European Patent Office as the International Searching Authority for International Application No. PCT/EP2013/002857. (6 pages).

(Continued)

*Primary Examiner* — Billy Lactaoen
(74) *Attorney, Agent, or Firm* — J. Bruce Schelkopf; Taft Stettinius & Hollister LLP

(57) ABSTRACT

A voltage and or current sensor device for use in medium- or high voltage application, wherein a sensor or sensors of the sensor device is or are arranged in a housing. To enhance communication between the sensor and an electronical device, in order to use maximum possible accuracy potential of the voltage and current sensors, a signal and/or data memory element is integrated in the sensor housing, or placed near the sensor such that the sensor device output signal can be directly evaluated.

15 Claims, 4 Drawing Sheets

(51) Int. Cl.
*G01R 1/04* (2006.01)
*G01R 19/15* (2006.01)
*G01R 19/155* (2006.01)

(52) U.S. Cl.
CPC ......... *G01R 19/155* (2013.01); *G01R 35/005* (2013.01); *G01R 19/00* (2013.01)

(58) Field of Classification Search
USPC ........................................................ 324/126
See application file for complete search history.

(56) References Cited

U.S. PATENT DOCUMENTS

| 2001/0043062 | A1  | 11/2001 | Reid |  |
|---|---|---|---|---|
| 2009/0008640 | A1* | 1/2009 | Matsubara | G01R 31/31717 257/48 |
| 2010/0057944 | A1  | 3/2010 | Eberhard |  |
| 2015/0111416 | A1* | 4/2015 | Krome | H01R 4/2433 439/404 |

FOREIGN PATENT DOCUMENTS

| CN | 102365553 A | 2/2012 |
|---|---|---|
| CN | 102782510 A | 11/2012 |
| DE | 41 14 921 A1 | 11/1992 |
| DE | 102008034078 A | 1/2010 |
| WO | WO 03/012462 A1 | 2/2003 |

OTHER PUBLICATIONS

Written Opinion (PCT/ISA/237) dated Nov. 15, 2015, by the European Patent Office as the International Searching Authority for International Application No. PCT/EP2013/002857. (10 pages).
Extended European Search Report dated Mar. 15, 2013, by the European Patent Office in corresponding European Patent Application No. 12006671.7-1560. (12 pages).
Melexis Microelectronic Integrated Systems: "MLX91206 Triaxis® Current Sensor IC Datasheet Rev40", Jul. 1, 2012, XP002692838, URL:http://www.melexis.com/Assets/MLX91206-Datasheet-5942. aspx.
"KEVCD A, Indoor combined sensor; Indoor current sensor", Apr. 30, 2011, pp. 1-8, XP055084794, URL:http://www05.abb.com/global/scot/scot235.nsf/veritydisplay/17feb181 c669c603c12578a1 002aa24b/$file/KEVCD A_1 VLC000588 Rev.-en 2011.04.pdf.
Chinese Office Action dated Sep. 8, 2016; Chinese Application No. 201380049808.2; ABB Technology AG; 39 pgs. (including translation).

* cited by examiner

CURRENT AND/OR VOLTAGE SENSOR DEVICE WITH A MEMORY ELEMENT

RELATED APPLICATION

This application claims priority as a continuation application under 35 U.S.C. § 120 to PCT/EP2013/002857, which was filed as an International Application on Sep. 30, 2013 designating the U.S., and which claims priority to European Application 12006671.7 filed in Europe on Sep. 24, 2012. The entire contents of these applications are hereby incorporated by reference in their entireties.

FIELD

The present disclosure relates to voltage and or current sensor devices for use in, for example, medium- or high voltage applications, and the sensor devices can have at least one voltage- and/or current sensor, wherein the sensor or the sensors of each sensor device is or are arranged in a housing, and a method for operation of the same.

BACKGROUND INFORMATION

Voltage and/or current sensing devices in medium voltage networks in the state of the art might be easily standardized in their parameters and they can achieve high measuring accuracy, in case the electronic devices which are connected to the sensing devices enable the use of correction or calibration factors. These factors are specific to each single sensing device, calculated and/or measured during routine tests of these devices. These factors then need to be mentioned on a label of such devices and during installation of these devices, the factors need to be manually inserted into software of the connected electronic device. As there might be several digit numbers used as a calibration factor, it is not so difficult to make a mistake in writing the number into software of the electronic device, thus resulting in incorrect information processed within the measuring device. The same can happen in the case when the correction/calibration factor is integrated into an actual transformation/division ratio of a given device. In this case the actual transformation ratio might be a number of several digits that must be manually inserted into a connected electronic device and mistakes can easily occur during this process.

All electronic elements which are necessary for the aforesaid purpose are installed normally in a separate electronic calculation and display device.

Sensors are elements, which are to be calibrated, and each sensor needs its own set of calibration parameters or actual transformation ratio. So the central electronic calculation unit has to consider each individual sensor parameter set. So the accuracy of such sensors, depends on the effectively of such parameter and data accuracy.

SUMMARY

A voltage and/or current sensor device is disclosed for use in a medium- or high voltage application, comprising: at least one voltage- and/or current sensor, wherein the sensor or sensors of the sensor device is or are arranged in a sensor housing; and a signal and/or data memory element integrated in the sensor housing, or placed near the at least one voltage and/or current sensor such that a sensor device output signal can be directly accessed for evaluation.

A method is also disclosed for operation of a voltage and/or current sensor device having at least one voltage- and/or current sensor, wherein the sensor or sensors of the sensor device is or are arranged in a sensor housing, and having a signal and/or data memory element integrated in the sensor housing, or placed near the at least one voltage and/or current sensor such that a sensor device output signal can be directly accessed for evaluation near the sensor location with a sensor or sensors related electronic data memory element, the method comprising: storing individual historical sensing data and/or individual calibration and/or parameter data into the data memory; and causing the data memory to communicate automatically with a central calculation and/or monitoring device.

DETAILED DESCRIPTION

Figure 1:
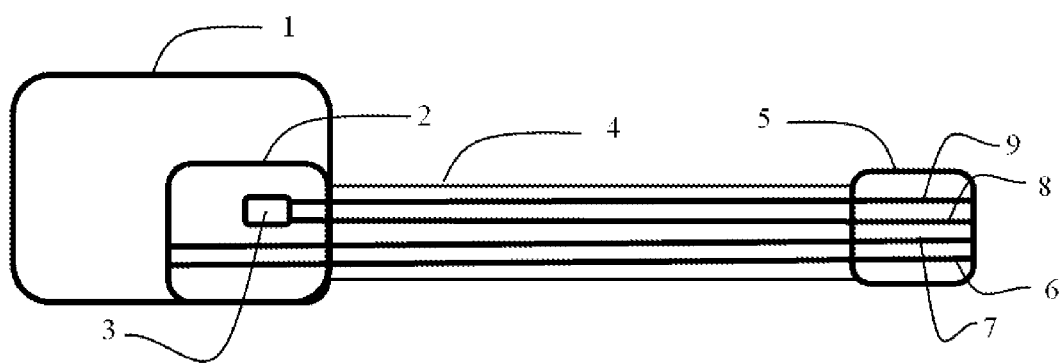
FIG. 1 shows exemplary placement of a memory element inside an insulating body or in a cavity of the current and/or voltage sensing device.

Exemplary embodiments of a device disclosed herein can enhance correspondence between the sensor and the electronical device, in order to use maximum possible accuracy potential of the voltage and/or current sensors.

For example, a signal and/or data memory element is integrated in the sensor housing, or placed near the sensor such that the sensor device output signal can be directly evaluated.

So it is realized, that each individual sensor is able to store its individual signal history as well as the individual calibration data set or actual transformation ratio information. This results furthermore in sensors with high accuracy.

Fortunately the housing can be a housing formed as a resin or plastic case filled by some material, the sensor housing or the sensor device housing being made of a resin, or of plastic with a filling of insulating material. This is easy to produce.

In an exemplary embodiment, the voltage and or current sensor device is equipped with a signal cable connector, and the near to the sensor placed memory element is integrated in the signal cable connector equipped at the end of the output cable of the sensor device.

So the sensor device includes (e.g., consists of) at least one current and/or voltage sensor, a housing, an output cable, and a connector, placed at the end of the output cable.

The memory element can be connected to the sensor device. Therefore, there could be two exemplary locations. One is to put it inside of the sensor device housing, and the other one is to place it in the boot of the connector.

But it could be that the memory element is outside of the connector or sensor device housing to, for example, centralize all memory elements from all sensor devices in one substation. In that case the memory element could be located some distance from the sensor device.

In an exemplary embodiment, the device is equipped with, or embellished as a clamp-on connector boot in such a way that further sensor-relevant or sensor-signal-relevant elements are integrated inside this boot or connector, and that fixation for a cable and connector connection can be used.

In an exemplary embodiment, at least one impedance element, which is a secondary impedance element of a voltage divider of the voltage sensor, is placed or integrated in that boot or connector, wherein the primary impedance element of the voltage divider is placed in the sensor device housing.

A connector boot in that sense is a connector housing.

The housing can be made of insulating material, or semiconductive material, or a conductive material. An advantage of the use of semi-conductive or conductive material, is that by that, a electromagnetic shielding is provided.

In an exemplary embodiment, the memory element is an Electrically Erasable Programmable Read-Only Memory (EEPROM) element.

According to an exemplary method, the voltage and/or current sensor is equipped near the sensor location with an electronic device, only to this individual sensor related data memory element, in such a way, that individual historical sensing data and/or individual calibration or parameter data are implemented into this data memory, and this data memory communicates automatically with a central calculation and/or monitoring device.

In case more than one sensing device is connected to same electronic device, one memory element containing information related to all connected sensing devices can be used. In that case it has to be assured, that sensing elements cannot be mixed and can be properly identified in order to assign correct parameters/correction data, stored in a memory element, to an appropriate sensing element.

In an exemplary embodiment, the correspondence (i.e., communication) between the data memory and the output evaluating device is operated via electrical wires, or via wireless access.

An exemplary modification of the method is that the data memory is furthermore equipped with an electronic device to retrieve its sensor data automatically after plug-on of the cable to be monitored.

So the memory element can be an Electrically Erasable Programmable Read-Only Memory (EEPROM) element, which is provided with correction factors of premanufactured sensors, additionally to its function of storing measurement data.

Exemplary embodiments include the use of a memory element which can be used to store the data related to the voltage and/or current sensing devices. Such data could be directly read by the connected measuring devices, without the need for manual insertion of the data into the measuring device. Location of such a memory element could be either in a cavity of a sensing device, where the output cable is being connected, or at the end of the cable where connector is used to provide standardized termination or interface to the measuring devices.

Exemplary embodiments can use an additional memory element, such as an EEPROM, which contains information about a value of a correction factor or actual transformation ratio. Information about a correction factor or actual transformation ratio is inserted into the memory element during routine tests of the voltage and/or current sensing devices. This information will be read by the measuring devices, once they are connected to the voltage and/or current sensing elements, thus enabling precise transfer of the information about a correction factor or factors or actual transformation ratio from the sensing device into the measuring device. Once this information enters the measuring device, it will be stored there and the measuring device does not need to further communicate or transfer the information about a correction factor or ratio again from the memory element inside of the sensing device.

A memory element can store data about correction factors or an actual transformation ratio, once this device is used, and it can recover and store much more information, such as serial number, type designation, production data, name of producer, parameters, dimensions, setting parameters, correction curves or look-up tables etc.

A location of the memory element (3) can varied based on a particular design of a voltage and/or current sensing device (1). In case there is a need for strong mechanical protection, it is possible to place the memory element into the insulating body of a voltage and/or current sensing device (1) or in a cavity (2) that is later properly fixed or covered, see FIG. 1.

Access of the connected measuring device to the memory element (3) can be done by means of one wire or more wires (8) and (9). Output wires (6) and (7) coming out of current and/or voltage sensing device are not affected by the signal going to/from the memory element (3). All wires (6), (7), (8) and (9) are located within the same connector, so once the sensing device is connected to the measuring device, connection to the memory element is enabled as well.

Common memory elements implement communication protocols such as I²C integrated circuits, or SPI (serial periperical interface bus) requiring 3 or more wires for the power supply of the memory element and for the data transfer. For simpler integration and lower costs it can be desirable to reduce the number of wires required by the memory element. It therefore can be beneficial to use a memory element where both the power supply function and the data transfer functions are achieved via one single wire such as in a 1-wire bus system.

Additionally, a temperature sensor may be installed in the sensor device sharing the same wires with the memory element. The temperature sensor may be included in the same integrated circuit with the memory element or in a separate integrated circuit.

Figure 2:
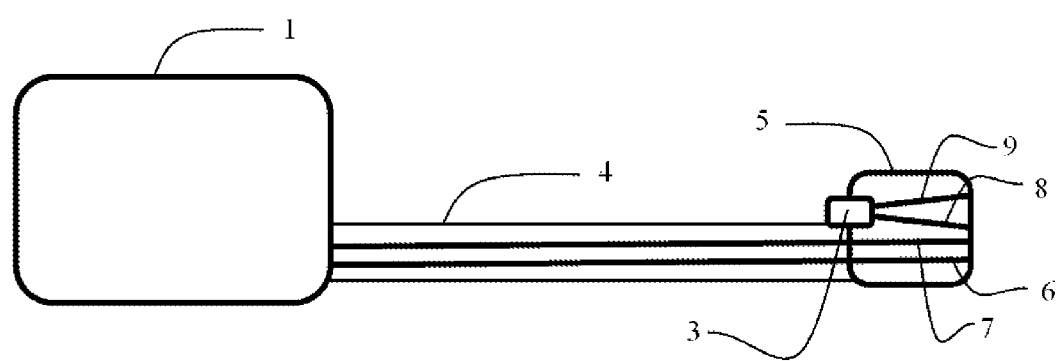
FIG. 2 shows exemplary placement of the memory element outside of the insulating body of the current and or voltage sensing device.

In case the insulating body of the sensing device exerts excessive mechanical pressure or temperature during a production process or during operation, it is beneficial to locate the memory element outside of the insulating body. In case the output cable is a part of a voltage and/or current sensing device, it might be possible to place the memory element at the end of that cable, simply there, where output wires of the sensing device might be easily accessible, see FIG. 2.

In case the memory element (3) is placed at the end of cable (4) and in case such end is equipped with a connector (5), the memory element can be placed within the connector (5) or in a connector boot.

Figure 3:
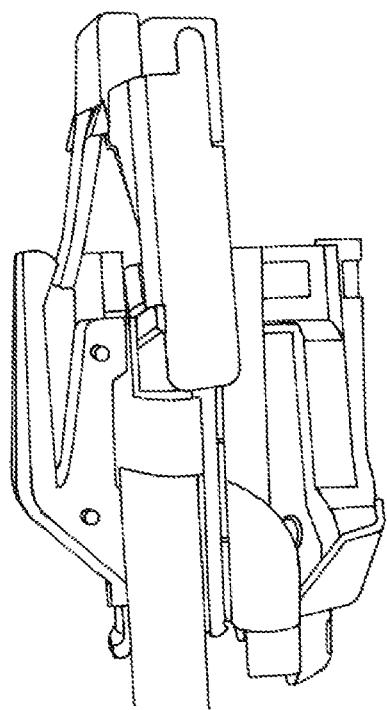
FIG. 3 shows an RJ45 connector with clamp-on boot.
Figure 3:
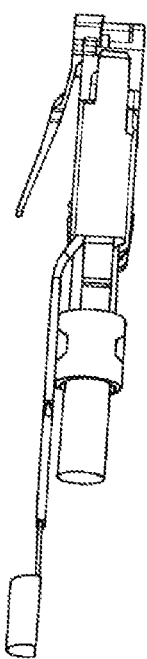

In an exemplary embodiment, such a connector (5) could be an RJ45 connector, with clamp-on boot for insulation and mechanical protection of that connector, having a cavity, which enables insertion of a small memory element. See FIG. 3.

Figure 4:
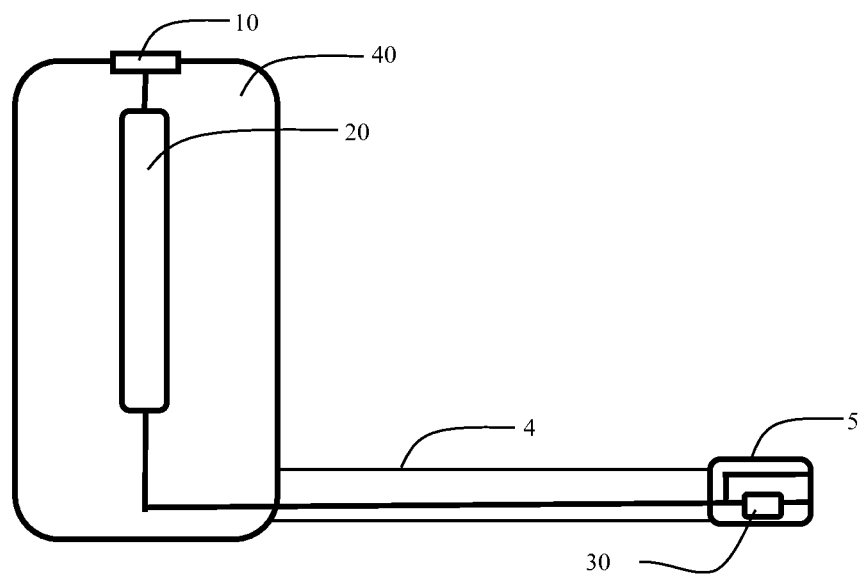
FIG. 4 shows an exemplary placement of a secondary impedance element of the voltage divider.

FIG. 4 shows a housing of the sensor device 1, wherein is located a first voltage divider impedance 20. In this Figure, voltage detectors or indicators, secondary impedances are located outside of the body or housing 1, which contains a primary impedance. Secondary impedance 30 can be included inside of the electronic devices to which a voltage detector is connected. Together, they can operate as voltage divider. As the products can be produced separately, it can be difficult to achieve very precise accuracy.

Therefore for a proper adjustment of voltage division accuracy after casting, it can be helpful to have both primary and secondary impedances aligned and tested together as one device.

As shown in FIG. 4, a voltage sensing device includes (e.g., consists of) primary terminal 10, primary impedance 20, secondary impedance 30, insulating body 40, output cable 4 with two output wires and output connector 5. Secondary impedance 30 is located in the separate connector boot, in a further intermediate terminal box. If so, the intermediate box can require an additional connection of the output cable and secondary impedance 30 and it also should be subsequently covered to prevent environmental influences and surrounding electric and/or magnetic fields in service. This may lead to higher costs of the device and also towards bigger or non-symmetric size of divider housing.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A voltage sensor device, comprising:
   at least one voltage sensor, wherein the sensor or sensors of the sensor device is or are arranged in a sensor housing;
   a signal and/or data memory element;
   information about a correction factor or actual transformation ratio of the sensor stored in the memory element;
   a connector configured to connect a measuring device to the voltage sensor device;
   one or more first wires connected to the sensor and the connector to output a sensor signal to the measuring device;
   one or more second wires connected to the memory element and the connector to transfer the information about the correction factor or actual transformation ratio to the measuring device;
   a primary impedance element of a voltage divider of the voltage sensor, placed in the sensor housing; and
   a secondary impedance element of the voltage divider of the voltage sensor, placed or integrated in the connector or a boot thereof.

2. The voltage sensor device according to claim 1, wherein the sensor housing or the sensor device housing is made of a resin, or of plastic with a filling of insulating material.

3. The voltage sensor device according to claim 1, wherein the voltage sensor device is equipped with a signal cable connector, and that the memory element is integrated in the signal cable connector equipped at the end of the output cable of the sensor device.

4. The voltage sensor device according to claim 3, wherein the device comprises:
   a clamp-on connector boot for fixation for a cable and RJ45 connector.

5. The voltage sensor device according to claim 1, wherein the memory element is within a housing made of insulating material.

6. The voltage sensor device according to claim 1, wherein the memory element is within a housing made of semiconductive material.

7. The voltage sensor device according to claim 1, wherein the memory element is within a housing made of conductive material.

8. The voltage sensor device according to claim 1, wherein the memory element is an Electrically Erasable Programmable Read-Only Memory (EEPROM) element, which is provided with correction and/or calibration factors of the sensors and/or with additional data, in addition to storing measurement data.

9. The voltage sensor device according to claim 2, wherein the voltage sensor device is equipped with a signal cable connector, and that the memory element is integrated in the signal cable connector equipped at the end of the output cable of the sensor device.

10. The voltage sensor device according to claim 9, wherein the device comprises:
    a clamp-on connector boot for fixation for a cable and RJ45 connector.

11. The voltage sensor device according to claim 10, wherein the memory element is within a housing made of insulating material.

12. The voltage sensor device according to claim 10, wherein the memory element is within a housing made of semiconductive material.

13. The voltage sensor device according to claim 10, wherein the memory element is within a housing made of conductive material.

14. The voltage sensor device according to claim 10, wherein the memory element is an Electrically Erasable Programmable Read-Only Memory (EEPROM) element, which is provided with correction and/or calibration factors of the sensors and/or with additional data, in addition to storing measurement data.

15. The voltage sensor device according to claim 1, wherein the memory element is integrated in the sensor housing, or placed in a cavity in the sensor housing.

* * * * *